Dec. 7, 1954 Q. A. KERNS 2,696,530

ELECTROSTATIC AMPLIFIER

Filed May 10, 1951

INVENTOR.
QUENTIN A. KERNS

BY
Roland A. Anderson

ATTORNEY.

2,696,530

ELECTROSTATIC AMPLIFIER

Quentin A. Kerns, Berkeley, Calif., assignor to the United States of America as represented by the United States Atomic Energy Commission Application May 10, 1951, Serial No. 225,518

2 Claims. (Cl. 179—171)

The present invention relates to improvements in amplifiers and the like and is more particularly concerned with a variable capacitance amplifier.

The present invention is in certain respects similar to electromagnetic amplifiers which are occupying an increasingly important position in the field owing to their desirable control characteristics; however, certain disadvantages are inherent to such type of amplifiers in that the required electromagnetic equipment is quite heavy and costly and further that an appreciable control current is required to maintain a desired operating state. The present invention embodies the desirable control characteristics of electromagnetic amplifiers without the attendant disadvantages and accomplishes this by employing electrically responsive capacitors whose capacitance is varied by a direct current signal voltage impressed thereon. By this means, heavy and expensive apparatus is eliminated and an inexpensive lightweight amplifier is presented which has, in addition to the well-known advantages of electromagnetic amplifiers, certain additional advantages peculiar only to this particular invention.

It is an object of the present invention to provide an improved electrostatic amplifier.

It is another object of the present invention to provide an improved amplifier controlled by electrically variable capacitors.

It is another object of the present invention to provide an improved power amplifier comprising only light, rugged and inexpensive components.

It is a further object of the present invention to provide an improved amplifier requiring substantially zero control power to maintain a steady state operating condition.

It is a still further object of the present invention to provide an improved power amplifier employing high frequency electrical energy to produce direct current power proportional to a direct current control bias.

A still further object of the present invention is to provide an amplifier employing resonant impedance to minimize power loss.

Figure 1:
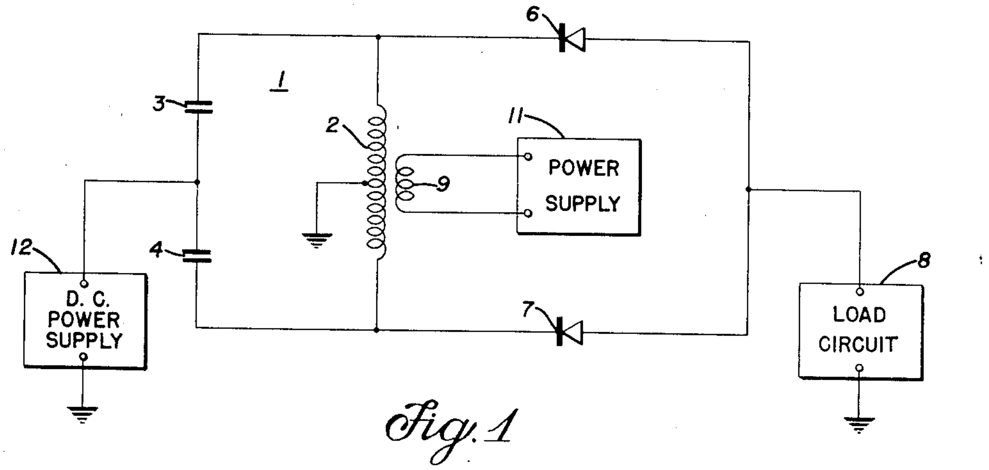
Figure 2:
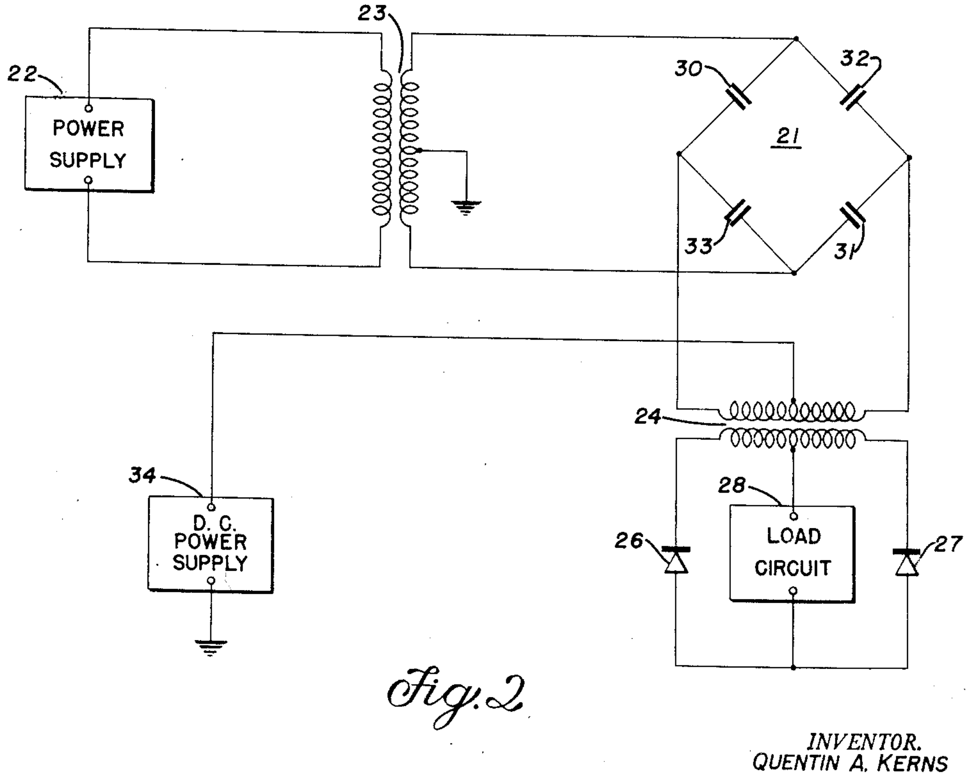

Numerous other objects and advantages of the present invention will be apparent from the following description taken together with the attached drawings wherein Figure 1 is a schematic illustration of a power amplifier utilizing resonant impedance, and Fig. 2 is a schematic illustration of a power amplifier utilizing a balanced bridge circuit.

Considering first the embodiment of the invention shown in Fig. 1, it will be seen that there is provided a tank circuit 1 including an inductor or coil 2 having a grounded midtap, and a pair of capacitors 3 and 4 connected in series across coil 2. A pair of rectifiers 6 and 7 are connected one to each end of coil 2 and to each other in such a manner as to provide full wave rectification. Rectifiers 6 and 7 may consist of any type of rectifier suitable for the particular application of the amplifier, and while diode vacuum tubes are very satisfactory in most instances, other types, such as tantalum rectifiers or disk-type rectifiers, may be employed where a more rugged design is desirable. As is shown in the drawing, rectifiers 6 and 7 are preferably connected to alternately conduct as by both being connected to conduct in a direction toward coil 2. A load circuit 8 is connected between ground and the common lead between rectifiers 6 and 7 and appropriate filter circuits may be inserted as desired between the rectifiers and load. Power is supplied to tank circuit 1 through a coil 9 which is inductively coupled to coil 2 and is connected to a power supply 11 feeding coil 9. It will be appreciated that power supply 11 has an alternating current output which in many instances is preferably of a high frequency. Amplifier control is provided by a direct current power supply 12 which is connected between ground and the juncture of capacitors 3 and 4 and provides a variable bias voltage for capacitors 3 and 4.

Considering now the operation of the embodiment of the invention illustrated in Fig. 1 and described above, it will be seen that coil 9 is energized by alternating current power supply 11. As coil 9 is inductively linked with coil 2, a voltage is induced in coil 2 by the current through coil 9. Coil 2 forms a part of tank circuit 1 whose resonant frequency is determined by the value of capacitors 3 and 4 and coil 2. Assuming that the current in coil 9 is alternating at the resonant frequency of tank circuit 1 a large current is induced in coil 2 and flows in circuit 1 because of the absence of any appreciable resistive component in the impedance thereof. The oscillating current of tank circuit 1 is rectified by rectifier units 6 and 7 and applied to a load circuit 8 and in the illustrated embodiment of the invention a ground return is utilized to complete the load circuit. Variation in load power is obtained by bias supply 12 which is effectively connected across capacitors 3 and 4 by means of the grounding of bias supply 12 and the midtap of coil 2. Control bias 12 produces a direct current voltage which is controllable at will or in response to a desired condition or phenomenon. Control results from the impression of this direct current bias across capacitors 3 and 4, inasmuch as the capacitance thereof varies as a function of impressed voltage. Numerous dielectrics exhibit the property of varying capacitance with impressed voltage and of these the titanate dielectrics have a rather wide capacitance range. Certain titanates including barium and/or strontium have proven very satisfactory in the illustrated circuit. Variation of the value of the bias voltage varies the capacitance of capacitors 3 and 4 which in turn change the resonant frequency of tank circuit 1. It will be appreciated that a maximum current oscillates in tank circuit 1 when circuit 1 is resonant at the frequency of the current in induction coil 9, while the current in circuit 1 decreases as the resonant frequency of circuit 1 becomes greater or less than the frequency of power supply 11.

From the foregoing it will be seen that, with a substantially constant frequency power supply 11 supplying coil 9, the current induced in coil 2 of tank circuit 1 is dependent upon the capacitance of capacitors 3 and 4 as is controlled by bias supply 12. Thus the illustrated device effectively produces a power output proportional to a control bias.

It is further to be noted that the capacitance of capacitors 3 and 4 is dependent upon the direct current voltage impressed thereon and that only this potential need be maintained by bias supply 12. In other words there is a power drain on the control bias only during the production of the reactive power required to change the bias on capacitors 3 and 4, and while the apparatus is operating in a steady state condition substantially zero current flows from control bias 12. This is a material advantage in that a power saving is effected thereby and further that design is thereby simplified. It is also possible in the circumstance of continually varying control bias to provide a feedback system whereby power consumption of the control bias is minimized.

Considering a further embodiment of the invention as shown in Fig. 2, it will be seen that a capacitance bridge circuit 21 is energized by a power supply 22 connected through a transformer 23 across two legs of the bridge. Load connections are made from opposite corners of bridge circuit 21 to a transformer 24 and a pair of rectifiers 26 and 27 are connected one to each end of the secondary of load transformer 24 in such a manner as to provide full wave rectification. A load circuit 28 is connected between the midtap of the secondary winding of load transformer 24 and the common terminal of rectifiers 26 and 27. Capacitance bridge 21 effectively comprises four capacitors with the capacitors 30 and 31 in opposite legs of the bridge being conventional fixed value capacitors and the other two capacitors 32 and 33 being capacitors whose value varies with impressed bias voltage, such as titanate capacitors.

Control is provided by a direct current power supply 34 connected to the midtap of the primary winding of load transformer 24. Power supply 34 is effectively connected across the legs of bridge circuit 21 by grounding the midtap of the secondary winding of input transformer 23 and grounding power supply 34, although direct connection may be made from power supply 34 to the input transformer secondary midtap.

It will be apparent from a consideration of the circuit of Fig. 2 that alternating current power supplied to bridge circuit 21 from power supply 22 through transformer 23 will produce no voltage on load transformer 24 when bridge circuit 21 is balanced. This balance of bridge 21 is obtained by applying a predetermined bias voltage from power supply 34 across bridge circuit 21 at the same points as power supply 22 is connected. With the proper value of bias voltage, variable capacitors 32 and 33 assume the proper capacitance to balance the impedance in opposite legs of bridge circuit 21 and no output voltage appears. A change in impressed bias voltage varies the capacitance of capacitors 32 and 33 and unbalances the impedance of opposite sides of bridge circuit 21 so that the voltage of the points of connection of load transformer 24 to bridge circuit 21 is not the same and a resulting load current flows. This load current is rectified and passed through load circuit 28.

It will be seen that operation of the embodiment employing a bridge circuit is substantially independent of the frequency of input power supply voltage which for many applications is very desirable.

That innumerable advantages attach to the above-described invention is believed evident. Of the more apparent advantages are the low cost, inasmuch as satisfactory dielectrics are commercially available for a few cents a piece, and portability, as only lightweight elements are employed, and the total absence of fragile equipment, such as vacuum tubes, makes it admirably suited for field work. Furthermore the lack of power loss in the control bias is in itself a great advantage.

The illustrated embodiments are in no wise to be taken as a limitation of the invention, for various circuits are possible within the scope of the invention. Also advantages lie in proper circuit design for particular applications as, for example, in the embodiment of Fig. 1, high frequency energization from power supply 11 and corresponding high frequency resonance of tank circuit 1 increases the rapidity of response inasmuch as response time is best maintained at more than at least one cycle of induced voltage, as otherwise excessive control power would be required. Furthermore, in the embodiment of Fig. 1, provision may be made for total cut-off of load current by means well known in the art, and where applicable, series resonance circuit may be employed instead of the parallel resonance circuit shown.

It will thus be seen that the present invention provides a highly advantageous amplifier operating by means of electrically varying capacitance and that the improved electrostatic amplifier of the present invention fulfills the objects set forth above. The invention is thus not to be limited by the above description but instead is to be measured only by terms of the following claims.

What is claimed is:

1. An electrostatic amplifier including output terminals connected across a direct current load and comprising a resonant circuit including a capacitor and an inductor having a midtap, a rectifier connected between each end of the inductor of said resonant circuit and one of said output terminals with the other of said output terminals connected to said inductor midtap, a coil inductively coupled to the inductor of said resonant circuit, a constant voltage and fixed frequency alternating current power supply means connected across said coil whereby said resonant circuit is inductively energized, the capacitor of said resonant circuit being variable in accordance with direct current voltage impressed thereon, and means impressing a variable direct current voltage on said capacitor whereby the resonant frequency of said resonant circuit is controllable and the power output at said output terminals is likewise controllable.

2. An electrostatic amplifier comprising a resonant circuit including an inductor having a grounded midtap and a pair of capacitors connected in series across said inductor, a rectifier connected to each end of said inductor, a grounded direct current load circuit connected to both of said rectifiers, a fixed frequency and constant voltage alternating current power supply, a coil connected across said power supply and inductively coupled with said inductor to energize said resonant circuit, and a direct current variable voltage power supply connected between ground and the juncture of said capacitors, said capacitors having a capacitance which varies with direct current voltage impressed thereon for tuning said resonant circuit whereby the power to said load circuit is a function of impressed direct current voltage.

References Cited in the file of this patent

UNITED STATES PATENTS

| Number | Name | Date |
|---|---|---|
| 2,191,315 | Guanella | Feb. 20, 1940 |
| 2,243,921 | Rust et al. | June 3, 1941 |
| 2,470,893 | Hepp | May 24, 1949 |